United States Patent [19]

Shibata

[11] Patent Number: 4,489,101

[45] Date of Patent: Dec. 18, 1984

[54] PATTERN FORMING METHOD

[75] Inventor: Hiroshi Shibata, Kanagawa, Japan

[73] Assignee: ULSI Technology Research Association, Japan

[21] Appl. No.: 423,364

[22] Filed: Sep. 24, 1982

Related U.S. Application Data

[63] Continuation of Ser. No. 171,506, Jul. 23, 1980, abandoned.

[30] Foreign Application Priority Data

Jul. 25, 1979 [JP] Japan .................................. 54-96215

[51] Int. Cl.³ .......................................... H01L 21/308
[52] U.S. Cl. ..................... 427/39; 156/643; 156/659.1; 427/94; 427/96; 427/259; 430/314; 204/192 E
[58] Field of Search ...................... 427/39, 96, 259, 94; 156/643, 659.1; 430/314; 204/192 E

[56] References Cited

U.S. PATENT DOCUMENTS

| | | | |
|---|---|---|---|
| 4,108,717 | 8/1978 | Widmann | 427/96 |
| 4,202,914 | 5/1980 | Havas | 156/643 |
| 4,223,048 | 9/1980 | Engle | 427/39 |
| 4,262,631 | 4/1981 | Kuback | 427/39 |

OTHER PUBLICATIONS

Grobman et al., "Electron–Beam Lithography", IEEE Transactions on Electron Devices, vol. ED-26, No. 4, pp. 360–367, Apr. 1979.
Blakeslee et al., "Aluminum Etch Mask for Plasma Etching" IBM TDB, vol. 21, No. 3, Aug. 1978, p. 1251.

Primary Examiner—John D. Smith
Attorney, Agent, or Firm—Sughrue, Mion, Zinn, Macpeak & Seas

[57] ABSTRACT

A pattern forming method for semiconductor devices in which a film layer of a compound containing silicon and nitrogen is formed between a substrate and a resist layer with a desired pattern readily formed utilizing a lift-off technique. A first film layer of a compound such as $Si_3N_4$ is formed on a semiconductor substrate with a resist film layer formed in a desired pattern upon the first film layer. The first film layer is etched using the resist film layer as a mask. A second film layer is then formed on the substrate after which the first film layer is removed with an etchant which does not attack the second film layer.

15 Claims, 13 Drawing Figures

PATTERN FORMING METHOD

This is a continuation of application Ser. No. 171,506, filed July 23, 1980, now abandoned.

BACKGROUND OF THE INVENTION

The present invention relates to a pattern forming method in which a desired pattern is formed utilizing a lift-off method.

In general, a lift-off method uses resist made of organic material which is soluble in organic solvent.

A conventional lift-off patterning method will be described with reference to FIG. 1. After resist 2 has been applied to one surface of a substrate as shown in FIG. 1a, a resist pattern is formed by photo-etching. It is desirable that the resist pattern thus formed be such that the resist in cross-section has a greatly inverted taper as shown in FIG. 1b. Then, film layers 3 are formed on the surfaces of the resist layer and on the exposed substrate 1 by vacuum evaporation or sputtering the material in a desired pattern as shown in FIG. 1c. The substrate 1 with the resist layer and the film layers 3 is immersed in a solvent. As a result, the resist 2 is dissolved in the solvent and therefore the film layer 3 on the resist layer 2 is removed. Thus, only the film layer 3 on the surface of the exposed substrate 1 remains to provide the desired pattern.

With this method, it is necessary to form the resist layer 2 relatively thick so that the film layer 3 on the surface of the exposed substrate 1 does not touch the film layer 3 on the resist layer 2. Accordingly, it is difficult to etch the resist layer 2 with a high accuracy and therefore the pattern formed by the film layer 3 is low in accuracy. This is one of the drawbacks accompanying the above-described conventional method.

A conventional method of providing a finer pattern than that formed by the method of FIG. 1 is illustrated in FIG. 2.

According to the second conventional method, a first resist layer 4 and a second resist layer 2 are successively formed on a substrate. Then, a first pattern is formed by photoetching the second resist layer 2. The pattern thus formed must have a considerably high dimensional accuracy and it must be opposite to or complementary to the pattern of a film layer 3 which is formed later.

Thereafter, a second pattern is formed by photoetching the first resist layer 4 or the like with the pattern of the second resist layer 2 as a mask. In this case, the pattern of the first resist layer 4 is developed more than the pattern of the second resist layer 2 so as to provide a resist section having overhanging portions as shown in FIG. 2b.

In the following step, a desired pattern is obtained by treating the aforementioned film layers 3 formed on the surfaces of the second resist layer 2 and of the exposed substrate 1. In this step, the above-described structure contributes greatly to the lifting off of the film layer 3 formed on the second resist layer 2 by vacuum-evaporation or the like. That is, in the lifting-off operation, a solvent dissolves the resist layers beginning with the lower resist layer 4 and therefore the lifting-off operation is readily accomplished to thereby obtain the desired pattern.

In accordance with this method, the resist layer 4 is interposed between the resist layer 2 and the substrate so that it is thus possible to make the resist layer 2 quite thin. Accordingly, the method of FIG. 2 can provide a finer pattern than the method of FIG. 1. However, the second method is still disadvantageous in that it is impossible to completely avoid the etching of the resist layer 2 while the resist layer 4 is being etched and hence the finally formed film layer 3 has a relatively low dimensional accuracy.

In addition to the above-described conventional methods, methods of using a polyamide material and an oxide film, respectively, instead of the resist layer 4 are known in the art. However, the first of these methods is disadvantageous in that it does not provide a sufficient resolution to form a fine pattern. The latter method is disadvantageous in that during etching of the oxide film, the undercut control is rather difficult if chemical etching is employed and, if plasma etching is employed for etching the oxide film, then the resist layer 2 is also etched and therefore it is difficult to obtain a pattern with the desired dimensional accuracy because the oxide film etching speed is not very high.

The above-described method in which the oxide film is interposed between the resist layer 2 and the substrate 1 is further disadvantageous in the following point. In the case where an oxide film has been previously formed on the substrate for a different purpose, it is impossible to etch only the oxide film in the middle stop. Accordingly, the method cannot be applied to a material in which at least an oxide film has previously been formed on the substrate.

For the methods in which the resist layer 4, the polyamide or the oxide film is interposed between the resist layer 2 and the substrate 1, it is difficult to satisfactorily control the dimensions of the overhanging portions with a high accuracy. Especially, in the method employing the resist layer 4, the resist is considerably thick and therefore it is extremely difficult to produce a very fine pattern in which the dimensions must be controlled in the sub-micron range.

SUMMARY OF THE INVENTION

Accordingly, an object of this invention is to form a fine pattern by interposing a film layer of a compound containing at least silicon and nitrogen, which may further contain hydrogen or oxygen and which is formed by plasma reaction and is essentially different in chemical etching characteristics or plasma etching characteristics from the conventional material described above.

According to the invention, a film layer of a compound containing silicon and nitrogen is formed between a substrate and a resist layer so that a desired pattern may be readily formed by the lift-off method. The desired pattern depends on a pattern formed with the resist layer.

Thus, the invention can be used to form a wiring layer made of metal or polycrystalline film on a substrate and furthermore the invention can be employed to form a wiring pattern with a film layer which has been formed on the wiring layer by a chemical vapor deposition method (hereinafter referred to as "the CVD method") or vacuum evaporation method with the wiring layer used as a mask.

The invention makes it possible to readily form a fine pattern less than one or two microns in line width the formation of which has heretofore been exceedingly difficult.

DESCRIPTION OF THE PREFERRED EMBODIMENTS

Preferred methods in accordance with the present invention will now be described. Referring now to FIGS. 3a–3d, a silicon nitride film layer 5 is formed on the surface of a substrate using a plasma CVD method. Then, the upper surface of the film layer 5 is coated with resist to form a resist layer 2. Thereafter, a pattern complementary to a desired pattern, that is a negative pattern, is formed on the resist layer 2 using an exposure method such as electron beam exposure, X-ray exposure or light exposure. Next, the film layer 5 formed using a plasma CVD method is subjected to plasma etching with the negative pattern as a mask.

With respect to the formation of the film layer 5 using a plasma CVD method, a gas mixture of silane and ammonia, silane and nitrogen, or silane, ammonia and nitrogen at a temperature of from 100° C. to 400° C. is supplied to a plasma generating reaction tube where the silane is decomposed under a pressure of about 0.1–1.5 Torr. to obtain silicon nitride. To form ordinary silicon nitride, the silane is decomposed at a high temperature of the order of about 600° C. to 800° C. and therefore the chemical formula of the silicon nitride is $Si_3N_4$. However, under the above-described conditions, the film which is formed contains excessive amounts of hydrogen or nitrogen and its reflection refractive index is 1.6 to 1.9 smaller than the ordinary value 2.0. The silicon nitride film layer 5 having such characteristics is etched at a rate of about 1000–6000 Å/min in a cylindrical plasma etching equipment under a $CF_4$ gas pressure of 1.0 Torr. and at high frequency power of 200 watts. Thus, the etching speed of the silicon nitride film layer 5 is more than several to ten times that a layer made with ordinary silicon nitride.

Because of this, a film layer several thousands of Ångstroms in thickness can be etched in two or three minutes while during this etching operation the resist layer 2 is hardly etched at all. As a result, the pattern thereby produced has a high dimensional accuracy. If, in this connection, the conditions of plasma etching are changed to control the lateral etching speed, then it is possible to provide uppercut and overhanging portions having dimensions as required thereby facilitating the removal of the resist layers which is carried out by a lifting-off method in the following manufacturing step.

Figure 3C:
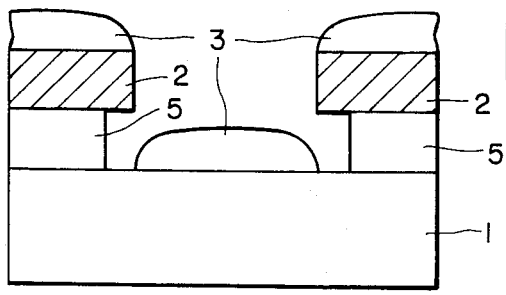
Figure 3D:
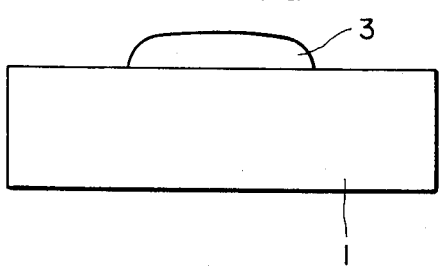

Thereafter, film layers 3 are formed on the resist layer 2 and the surface of the exposed substrate 1 by vacuum evaporating a metal such as aluminum similar to the ordinary lift-off technique as shown in of FIG. 3c. Then, the substrate 1 with the resist layers 2 and 5 and the metal film layers 3 is immersed in a solvent capable of dissolving the resist as a result of which the resist layer 2 is dissolved in the solvent and accordingly the metal film layer 3 on the resist layer 2 is removed. The film layer 5 is then removed by etching in a plasma atmosphere which does not etch aluminum as a result of which a pattern of metal such as one of aluminum is left on the substrate 1 as shown in FIG. 3d.

In the above-described method of the invention, aluminum is employed as the wiring pattern forming material. However, it is obvious that other metals and other materials such as for instance polycrystalline silicon may be employed.

Figure 1A:
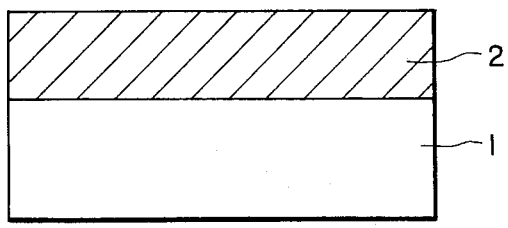
FIGS. 1a to 1d are sectional views for a description of a conventional pattern forming method.
Figure 1B:
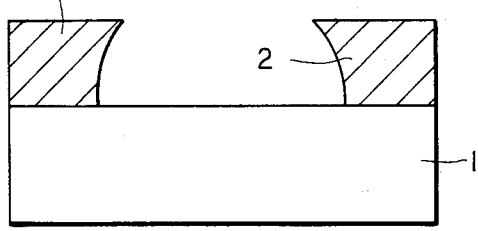
Figure 2A:
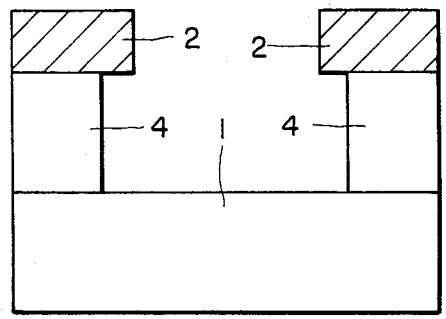
FIGS. 2a and 2b are sectional views for a description of an improvement of the conventional pattern forming method shown in FIGS. 1a to 1d.
Figure 1C:
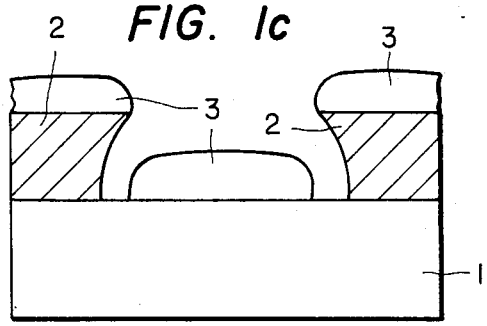
Figure 2B:
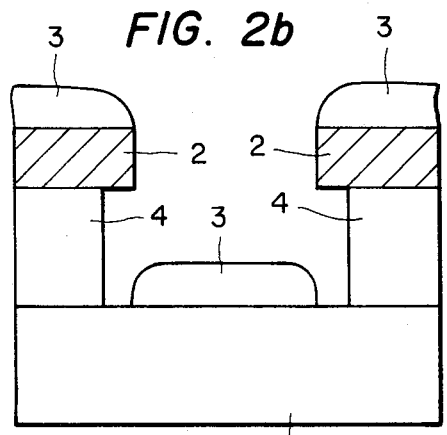
Figure 1D:
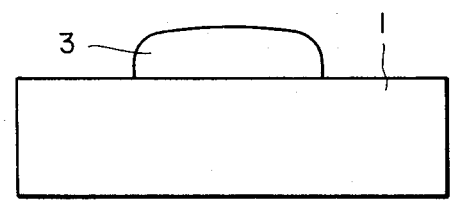
Figure 3A:
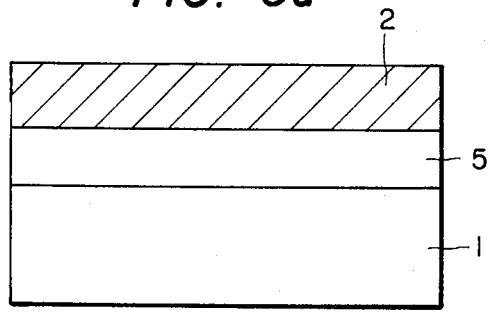
FIGS. 3a to 3d are sectional views for a description of an example of a pattern forming method according to the invention.
Figure 4A:
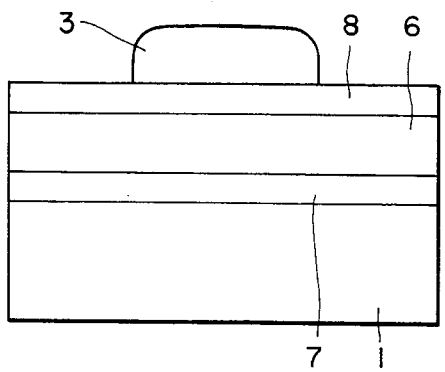
FIGS. 4a to 4c are also sectional views for a description of another example of the pattern forming method of the invention.
Figure 3B:
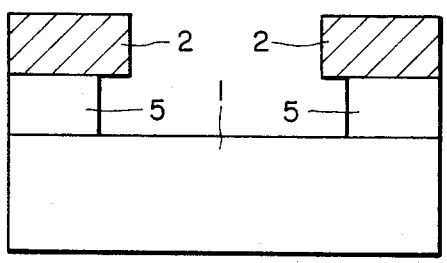
Figure 4B:
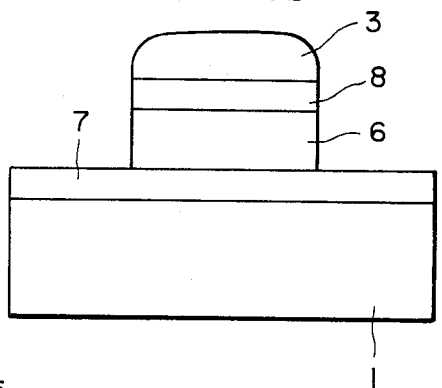

The pattern of aluminum film 3 formed as described above can be utilized as follows. That is, if an under-film layer which has been formed in advance is subjected to plasma etching or sputter etching with the aluminum pattern used 3 as a mask, then a pattern can be formed with the under-film layer as shown in FIG. 4a. More specifically, a film such as a silicon nitride film, a polycrystalline silicon film or a molybdenum film which is different in plasma etching or chemical etching characteristics from the film 3 is employed as an under-film layer 6 formed on an oxide film layer 7. Then, these layers are subjected to plasma etching with a gas mixture of $CF_4$ and several percent of $O_2$. In this etching operation, the film layer 3 is not etched at all thus serving as the mask while the under-film layer 6, namely, the silicon nitride film layer or the polycrystalline silicon film layer, is sufficiently etched under suitable conditions as a result of which the pattern of the under-film layer 6 is formed as shown in FIG. 4b. In subjecting the under-film layer 6 to plasma etching with the aluminum film layer 3 as the mask, not only $CF_4$ gases but also $CCl_4$ gases at low temperatures (lower than 185° C.) can be employed.

Figure 4C:
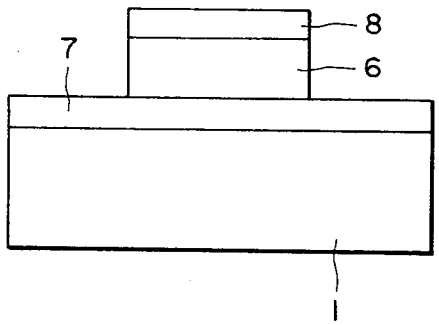

If plasma etching is carried out with a gas mixture of $CF_4$ and $H_2$, for instance, before the under-film layer 6 is etched, then only the oxide film layer 8 will be etched. After the film layers 8 and 6 have been etched, the remaining layers are immersed in phosphoric acid as a result of which the aluminum film layer 3 is removed and accordingly a pattern is formed as shown in FIG. 4c.

As is clear from the above description, according to the invention, the final pattern to be formed depends on the pattern of the resist layer on the silicon nitride film layer which is formed by the plasma CVD method. As it is possible to make the resist layer considerably thin, it may be formed having very fine dimensions and therefore the final pattern provided therefrom is considerably high in dimensional accuracy. This is one of the merits of the invention.

Furthermore, as the silicon nitride film layer formed by the plasma CVD method is considerably uniform in thickness and quality, the undercut, that is, the overhanging portion, can be readily formed with a high accuracy by plasma etching the silicon nitride film layer. Therefore, the distance between wiring parts of aluminum, for instance, can be reduced with high accuracy. For instance, in the case where the resist layer 2 is formed to a 4000 Å thickness using an electronic resist PMMA and the silicon nitride film layer 5 is formed to a thickness of 3000 Å by a plasma CVD method, a considerably fine pattern can be obtained in which the width of a line of aluminum film 3 is 0.54 μm and the distance between such lines is 0.46 μm. The width of the line and the distance between the lines can be further decreased by improving the processing accuracy.

Thus, the invention can be applied extensively to various processes in manufacturing semiconductor devices and memory elements such as bubble memories, in forming diffraction gratings, and in processing substrates having fine patterns such as printed circuit boards.

What is claimed is:

1. A pattern forming method comprising the steps of:
   forming a first film layer of a compound containing silicon and nitrogen directly on a substrate by plasma reaction;
   forming a resist film layer in a desired pattern on said first film layer;
   etching said first film layer at a rate of 1000–6000 Å/min with $CF_4$ gas at a pressure of approximately 1.0 Torr. with a power of 200 watts with said resist film layer as a mask;
   forming a second film layer on said substrate having said first film layer thus etched and on the resist film layer; and
   removing said first film layer from said substrate with an etchant which does not etch said second film layer.

2. A pattern forming method as claimed in claim 1, wherein said compound containing silicon and nitrogen has a reflection refractive index of 1.6 to 1.9.

3. The method according to claim 1, wherein after forming the second film layer and before removing the first film layer from the substrate, dissolving the resist film layer to remove the second film layer present on the resist film layer.

4. The method according to claim 1, wherein the etching of the first film layer is controlled so that the resist film layer overhangs the etched first film layer.

5. A pattern forming method comprising the steps of:
   forming a first film layer of a compound containing silicon and nitrogen directly on a substrate by plasma reaction, wherein the substrate comprises multiple layers;
   forming a resist film layer in a desired pattern on said first layer;
   etching said first film layer at a rate of 1000–6000 Å/min with $CF_4$ gas at a temperature of approximately 1.0 Torr. with a power of 200 watts with said resist film layer as a mask;
   forming a second film layer on said substrate having said first film layer thus etched and on the resist film layer;
   removing said first film layer from said substrate with an etchant which does not etch said second film layer; and
   etching at least one of the multiple layers of said substrate with said second film layer as a mask with an etchant which does not etch said second film layer.

6. A pattern forming method as claimed in claim 5, wherein said compound containing silicon and nitrogen has a reflection refractive index of 1.6 to 1.9.

7. The method according to claim 5, wherein after forming the second film layer and before removing the first film layer from the substrate, dissolving the resist film layer to remove the second film layer present on the resist film layer.

8. The method according to claim 5, wherein the etching of the first film layer is controlled so that the resist film layer overhangs the etched first film layer.

9. The pattern forming method of claim 1 or 5 wherein said compound containing silicon and nitrogen comprises $Si_3N_4$.

10. The pattern forming method of claim 1 or 5 wherein said step of forming a first film layer comprises a step of plasma CVD deposition utilizing a gas mixture selected from the group consisting of silane and ammonia, silane and nitrogen, and silane, ammonia and nitrogen.

11. The pattern forming method of claim 1 or 5 wherein said step of forming said first film layer comprises a step of plasma CVD deposition utilizing a gas mixture selected from the group consisting of silane and ammonia, silane and nitrogen, and silane, ammonia and nitrogen at a temperature of 100° C. to 400° C. in a plasma generating reaction tube at a pressure of 0.1 to 1.5 Torr.

12. A pattern forming method comprising the steps of:
   forming a first film layer of a compound containing silicon and nitrogen, said compound having a reflection refractive index of 1.6 to 1.9, said layer of said compound being formed directly on a substrate by a plasma reaction;
   forming a resist film layer in a desired pattern on said first film layer;
   etching said first film layer at a rate of about 1000–6000 Å/min in a cylindrical plasma etching device under $CF_4$ gas pressure of 1.0 Torr. at a power of 200 watts;
   forming a second film layer on said substrate having said first film layer thus etched and on the resist film layer; and
   removing said first film layer from said substrate with an etchant which does not etch said second film layer.

13. A method as claimed in claim 12, wherein said first film layer is formed by a plasma CVD method, utilizing a gas mixture of gases selected from the groups consisting of silane and ammonia, silane and nitrogen, or silane, ammonia and nitrogen, said method being carried out at a temperature of 100° C. to 400° C., said gas mixture being supplied to a plasma generating reaction tube wherein said silane is decomposed under a pressure of about 0.1–1.5 Torr.

14. The method according to claim 12, wherein after forming the second film layer and before removing the first film layer from the substrate, dissolving the resist film layer to remove the second film layer present in the resist film layer.

15. The method according to claim 12, wherein the etching of the first film layer is controlled so that the resist film layer overhangs the etched first film layer.

* * * * *